United States Patent
Thirukkovalur et al.

(10) Patent No.: US 7,410,893 B2
(45) Date of Patent: Aug. 12, 2008

(54) SYSTEM AND METHOD FOR DEPOSITING A SEED LAYER

(75) Inventors: Niranjan Thirukkovalur, Corvallis, OR (US); Thomas J. Lindner, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 448 days.

(21) Appl. No.: 11/101,668

(22) Filed: Apr. 8, 2005

(65) Prior Publication Data

US 2006/0228887 A1    Oct. 12, 2006

(51) Int. Cl.
*H01L 21/44* (2006.01)
(52) U.S. Cl. ............... 438/609; 257/E21.161; 257/E21.596; 438/608
(58) Field of Classification Search ............ 438/608, 438/609; 257/E21.161, E21.586
See application file for complete search history.

(56) References Cited

U.S. PATENT DOCUMENTS

| | | | | |
|---|---|---|---|---|
| 3,993,799 | A * | 11/1976 | Feldstein | 430/315 |
| 7,067,843 | B2 * | 6/2006 | Carcia et al. | 257/59 |
| 2002/0157271 | A1 * | 10/2002 | Ekholm et al. | 33/551 |
| 2002/0187895 | A1 * | 12/2002 | Izaki et al. | 502/330 |
| 2003/0175411 | A1 | 9/2003 | Kodas et al. | |
| 2003/0180451 | A1 | 9/2003 | Kodas et al. | |
| 2003/0228743 | A1 * | 12/2003 | Fukunaga et al. | 438/584 |
| 2003/0230967 | A1 | 12/2003 | Kawamura et al. | |
| 2004/0023253 | A1 | 2/2004 | Kunwar et al. | |
| 2004/0038808 | A1 | 2/2004 | Hampden-Smith et al. | |

* cited by examiner

*Primary Examiner*—Asok K Sarkar

(57) ABSTRACT

A method for depositing a seed layer for a controllable electric pathway on a substrate includes selectively dispensing a seed material from an inkjet material dispenser onto said substrate.

19 Claims, 10 Drawing Sheets

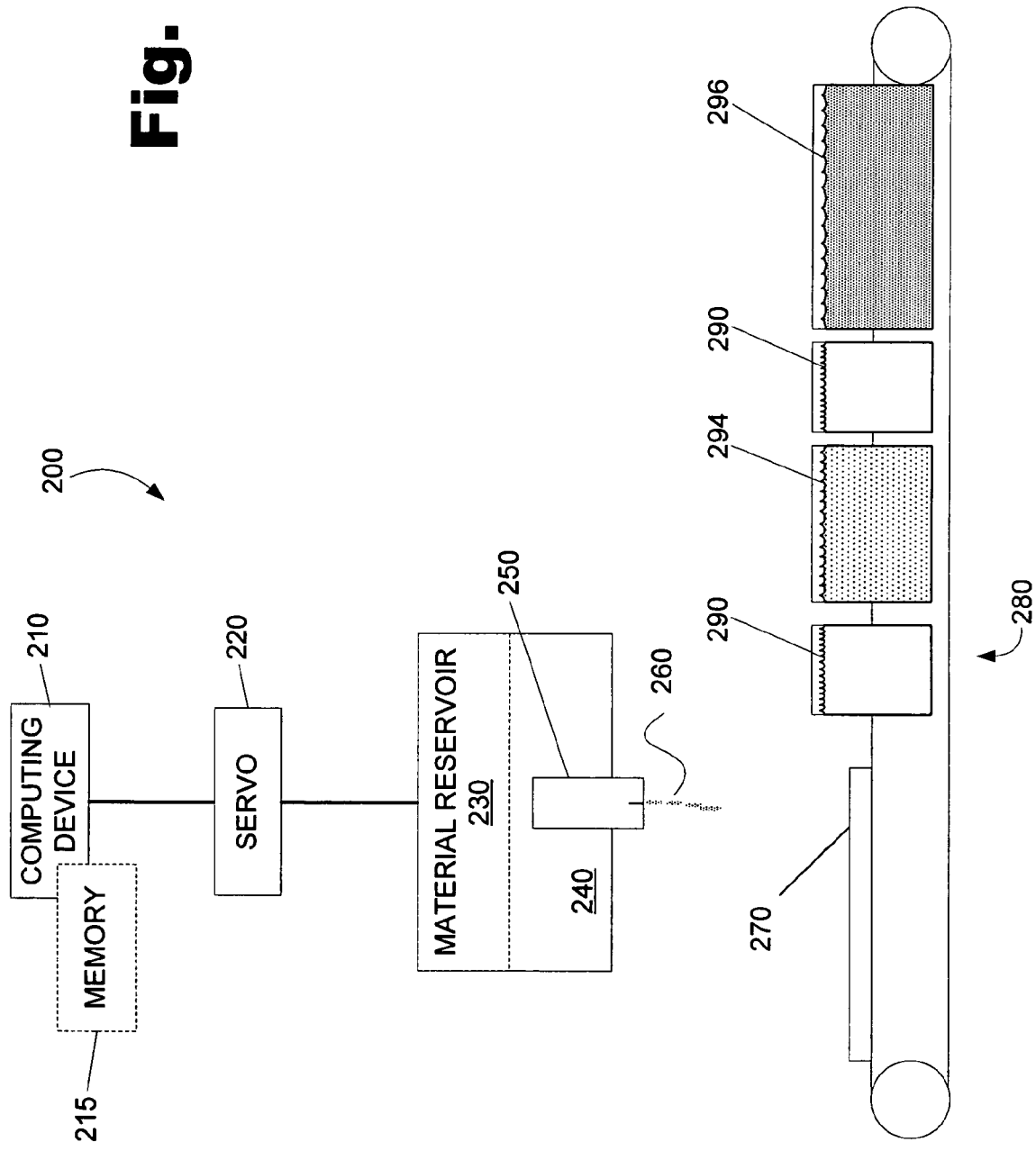

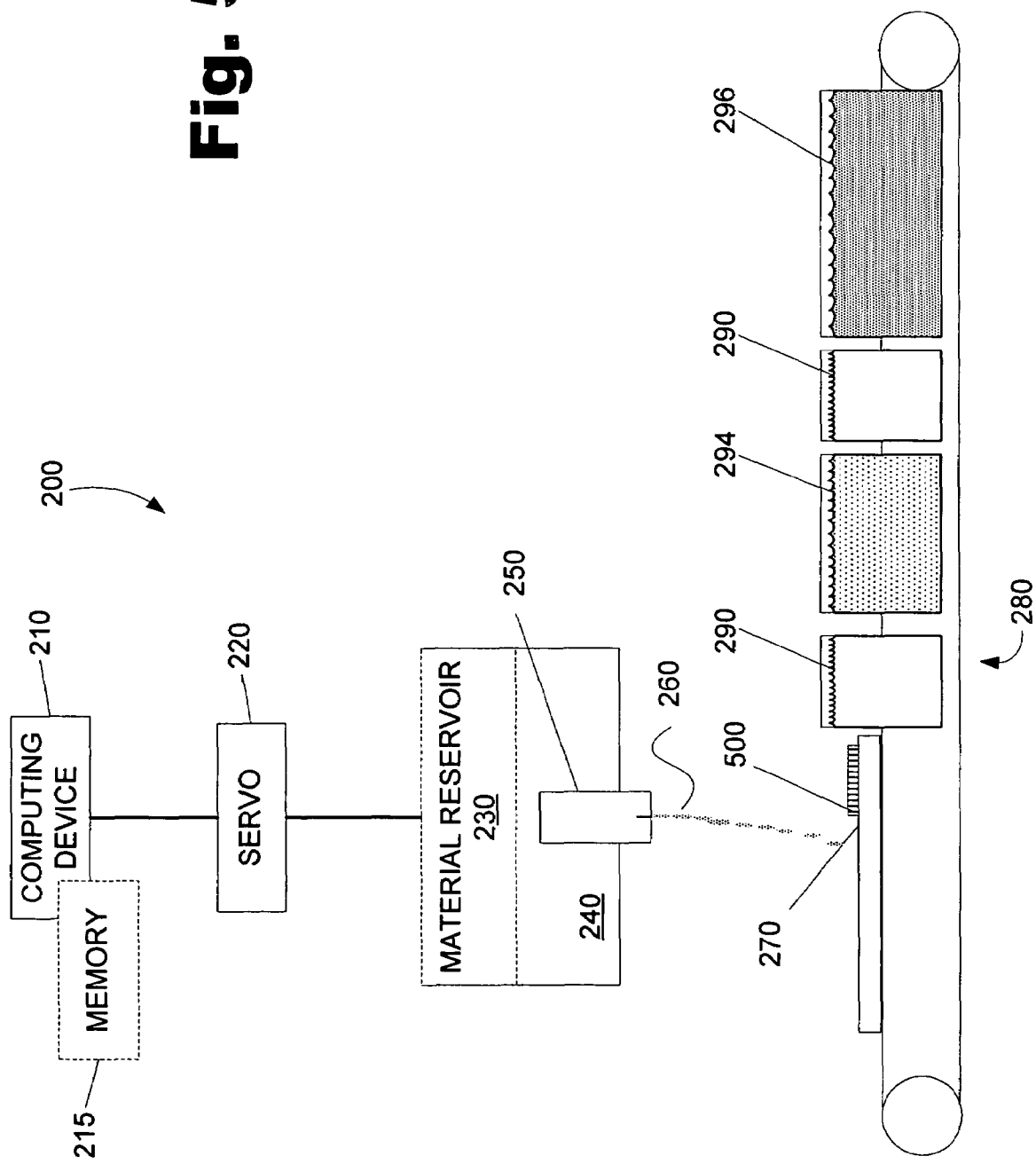

SYSTEM AND METHOD FOR DEPOSITING A SEED LAYER

BACKGROUND

Zinc oxide is a transparent semiconducting material that has applications in liquid crystal displays, photovoltaic devices, and surface acoustic wave devices. Traditionally, zinc oxide is formed on a desired substrate through conventional photolithographic methods or shadow masking. However, traditional methods used for the deposition of zinc oxide are often expensive, make inefficient use of materials, and are difficult to change patterning.

SUMMARY

An exemplary method for depositing a seed layer for a controllable electric pathway on a substrate comprising selectively dispensing a seed material from an inkjet material dispenser onto said substrate.

In another exemplary embodiment, a system for depositing seed layer on a substrate includes an inkjet material dispenser configured to deposit seed layer material onto the substrate.

BRIEF DESCRIPTION OF THE DRAWINGS

The accompanying drawings illustrate various embodiments of the present system and method and are a part of the specification. The illustrated embodiments are merely examples of the present system and method and do not limit the scope thereof.

FIG. 2 illustrates a schematic view of a seed layer depositing system, according to one exemplary embodiment.

FIG. 5A is a system view illustrating a deposition of seed material, according to one exemplary embodiment.

Throughout the drawings, identical reference numbers designate similar, but not necessarily identical, elements.

DETAILED DESCRIPTION

An exemplary system and method for depositing seed layers to be used in performing electroless plating on a desired substrate are disclosed herein. Specifically, exemplary systems and methods for depositing zinc oxide on a desired substrate are described in detail. According to one exemplary method, a seed layer of the desired zinc oxide deposition is selectively deposited on a substrate by an inkjet material dispenser. Additionally, an exemplary system for the deposition of zinc oxide seed layers including an inkjet material dispenser is disclosed herein. Embodiments and examples of the present exemplary systems and methods will be described in detail below.

As used herein, and in the appended claims, the term "electroless plating" shall be understood to refer to any deposition of a metallic coating onto a substrate by a controlled chemical reduction that is catalyzed by the metal or alloy being deposited.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure.

Figure 1A:
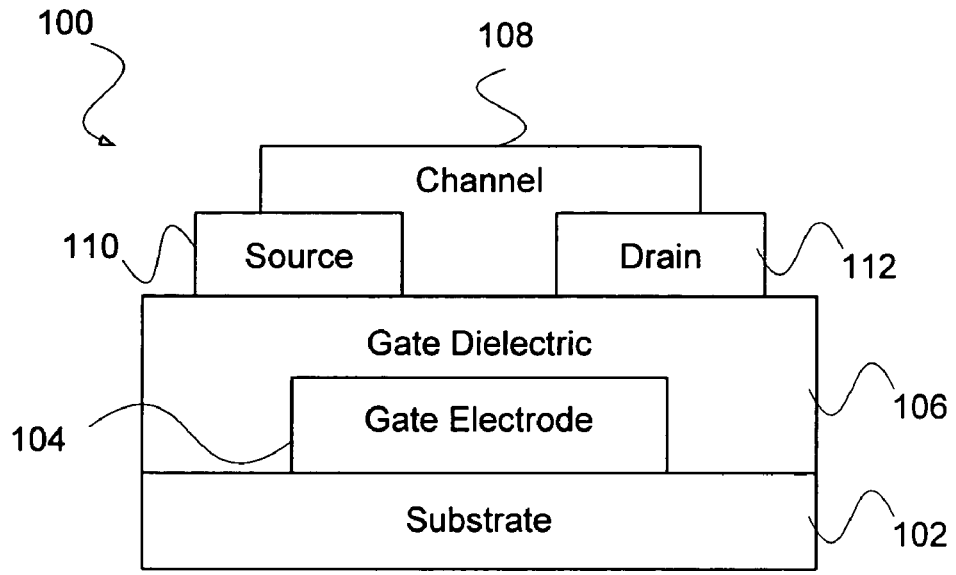
FIGS. 1A and 1B illustrate various embodiments of a semiconductor device, such as a thin-film transistor.
Figure 1B:
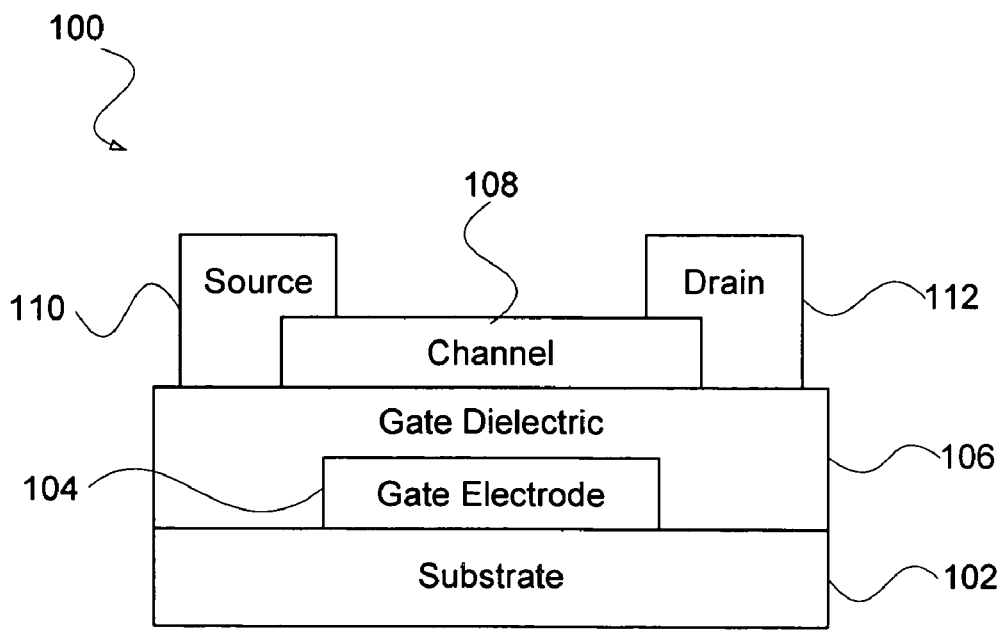

It should also be understood that various semi-conducting devices such as transistor structures may be employed in connection with the various embodiments of the present exemplary systems and methods. For example, the present systems and methods may be incorporated to form any number of semiconductor structures, field effect transistors including thin-film transistors, active matrix displays, logic inverters, amplifiers, and the like. As illustrated in FIGS. 1A-1B, exemplary thin-film transistor embodiments may be formed with the present systems and methods. The thin-film transistors can be of any type including, but not limited to, horizontal, vertical, coplanar electrode, staggered electrode, top-gate, bottom-gate, single-gate, and double-gate transistors, just to name a few.

In the following description, for purposes of explanation, numerous specific details are set forth in order to provide a thorough understanding of the present system and method for selectively forming a zinc oxide layer on a desired substrate. It will be apparent, however, to one skilled in the art, that the present method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary Structure

FIGS. 1A and 1B illustrate embodiments of bottom-gate transistors that may be formed by the present exemplary systems and methods. According to various embodiments, the thin-film transistor (100) can form a portion of any number of devices including, but in no way limited to, an active matrix display device, such as an active matrix liquid crystal display (AMLCD) device; an active matrix detection device, such as an active matrix x-ray detector device; a logic gate, such as a logic inverter; and/or an analog circuit, such as an amplifier. The thin-film transistor (100) can also be included in an infrared device where transparent components are used.

While FIGS. 1A and 1B illustrate only a few bottom-gate transistors, the present exemplary systems and methods may be used to form any number of semi-conducting apparatuses containing zinc oxide in various configurations. As shown in FIGS. 1A and 1B, the exemplary transistors include a substrate (102), a gate electrode (104), a gate dielectric (106), a channel (108), a source electrode (110), and a drain electrode (112). Further, in each of the bottom-gate transistors, the gate dielectric (106) is positioned between the gate electrode (104) and the source and drain electrodes (110, 112) such that the gate dielectric (106) physically separates the gate electrode (104) from the source and the drain electrodes (110, 112). Additionally, in each of the exemplary bottom-gate transistors, the source and the drain electrodes (110, 112) are separately positioned, thereby forming a region between the source and drain electrodes (110, 112) for interposing the channel (108). Consequently, the gate dielectric (106) is positioned adjacent the channel (108) and physically separates the source and drain electrodes (110,112) from the gate electrode (104). Further, the channel (108) is positioned adjacent the gate dielectric (106) and is interposed between the source and drain electrodes (110, 112).

In each of FIGS. 1A and 1B, the channel (108) interposed between the source and the drain electrodes (110, 112) may be made of a semi-conducting material such as zinc oxide to provide a controllable electric pathway configured to selectively facilitate a movement of an electrical charge between the source and drain electrodes (110, 112) via the channel (108). The formation of the semi-conducting zinc oxide channel (108) along with an exemplary system configured to form the zinc oxide will be provided below. While the present exemplary system and method will be described in the context of forming a zinc oxide channel, any number of seed layers configured to be used in electroless plating may be formed according to the present exemplary systems and methods.

FIG. 2 illustrates an exemplary system (200) that may be used to form a seed layer on a desired substrate (270) with subsequent formation of a zinc oxide layer, according to one exemplary embodiment. As illustrated in FIG. 2, zinc oxide seed material (260) may be independently applied to a desired substrate (270) from one or more inkjet material dispenser(s) (250). As shown, the present system includes a computing device (210) controllably coupled through a servo mechanism (220) to a moveable carriage (240) having the inkjet material dispenser (250) disposed thereon. A material reservoir (230) is also coupled to the moveable carriage (240), and consequently to the inkjet print head (250). A transporting medium (280) having the desired substrate (270) disposed thereon is located adjacent to the inkjet material dispenser (250). Additionally, as illustrated in FIG. 2, a number of solution baths (290, 294, 296) are disposed near or on the transporting medium (280). While the present embodiment is described, for ease of explanation only, in the context of forming a zinc oxide channel layer on the desired substrate (270), the present system and method may be used to form any number of zinc oxide configurations on any receiving substrates including, but in no way limited to, printed circuit boards, switches, etc. The above-mentioned components of the present system will now be described in further detail below.

The computing device (210) that is controllably coupled to the servo mechanism (220), as shown in FIG. 2, controls the selective deposition of the seed material (260) in preparation of a zinc oxide deposition. According to one exemplary embodiment, a representation of a desired structure or trace pattern may be formed using a program hosted by the computing device (210). That representation of the desired structure or pattern may then be converted into servo instructions that are housed in a processor readable medium or memory (215). When accessed by the computing device (210), the instructions housed in the processor readable medium (215) may be used to control the servo mechanisms (220) as well as the movable carriage (240) and inkjet material dispenser (250), thereby forming the desired array structure or pattern. The computing device (210) illustrated in FIG. 2 may be, but is in no way limited to, a workstation, a personal computer, a laptop, a personal digital assistant (PDA), or any other processor containing device.

The moveable carriage (240) of the present exemplary system (200) illustrated in FIG. 2 is a moveable material dispenser that may include any number of inkjet material dispensers (250) configured to dispense the present seed material (260). The moveable carriage (240) may be controlled by the computing device (210) and may be controllably moved by, for example, a shaft system, a belt system, a chain system, etc. making up the servo mechanism (220). As the moveable carriage (240) operates, the computing device (210) may inform a user of operating conditions as well as provide the user with a user interface. Alternatively, the desired substrate (270) may be selectively translated under a stationary inkjet material dispenser (250) by a servo mechanism.

As a desired structure or pattern of seed material is printed on a desired substrate (270), the computing device (210) may controllably position the moveable carriage (240) and direct one or more of the inkjet material dispensers (250) to selectively dispense the seed material (260) at predetermined locations on the desired substrate (270) as digitally addressed drops, thereby forming layers of the desired seed material. The inkjet material dispensers (250) used by the present printing system (200) may be any type of inkjet dispenser configured to perform the present method including, but in no way limited to, thermally actuated inkjet dispensers, mechanically actuated inkjet dispensers, electrostatically actuated inkjet dispensers, magnetically actuated dispensers, piezoelectrically actuated dispensers, continuous inkjet dispensers, etc. For ease of explanation only, the present exemplary system and method will be described in the context of a thermally actuated inkjet material dispenser.

The material reservoir (230) that is fluidly coupled to the inkjet material dispenser (250) houses the present seed material (260) prior to printing. The material reservoir may be any container configured to hermetically seal the present seed material (260) prior to printing and may be constructed of any number of materials including, but in no way limited to metals, plastics, composites, or ceramics. Moreover, the material reservoir (230) may be an off-axis or on-axis component. According to one exemplary embodiment illustrated in FIG. 1, the material reservoir (230) is an on-axis component that forms an integral part of the moveable carriage (240). A number of exemplary seed materials will be described in further detail below with reference to FIGS. 4A and 4B.

Continuing with FIG. 2, the transporting medium supports a desired substrate (270) configured to receive the seed material (260). According to one exemplary embodiment, the desired substrate (270) may include glass and a number of dielectric components as mentioned above. Alternatively, however, the desired substrate (270) configured to receive a zinc oxide seed material (260) according to the present exemplary system and method can include any suitable substrate material or composition for implementing the various embodiments. For example, the desired substrate (270) may include, but is in no way limited to, a silicon wafer, with or without layers or structures formed thereon, used in forming integrated circuits, and in particular thin-film transistors as described herein; glass; quartz; organic substrate materials; polymeric substrate materials; and the like. Furthermore, other substrates can be used in connection with the present systems and methods including, but in no way limited to, fibers, wires, etc. In general, the films can be formed directly on the lowest surface of the substrate or on any of a variety of the layers (i.e., surfaces) as in a patterned wafer, for example.

Further, as mentioned previously, the present exemplary system includes a number of solution baths (290, 294, 296) disposed near or on the transporting medium (280). According to the exemplary embodiment illustrated in FIG. 2, the solution baths include a number of rinsing baths (290), a palladium isolating bath (294), and a zinc oxide bath (296).

According to one exemplary embodiment, the plurality of rinsing baths (290) includes a de-ionized water solution. This de-ionized water solution is configured to remove excess particles and/or solutions during the present exemplary method.

As illustrated in FIG. 2, the present exemplary system (200) also includes a palladium isolating bath (294). The contents of the palladium isolating bath (294) vary depending on the content of the seed material (260). According to the present exemplary embodiment, the palladium isolating bath (294) may include, but is in no way limited to, a dilute palladium chloride solution or an accelerator such as fluoroboric acid and/or sulfuric acid. The appropriate palladium isolating bath (294) that corresponds with the seed material (260) will be discussed in further detail below with reference to FIGS. 4A and 4B.

The zinc oxide bath (296) illustrated in FIG. 2 includes a zinc oxide plating solution configured to deposit zinc oxide where palladium has been isolated on the desired substrate (270). According to one exemplary embodiment, the zinc oxide plating solution includes, but is in no way limited to, zinc nitrate and dimethylamine borane. A number of exemplary methods for selectively depositing zinc oxide onto a desired substrate (270) will now be described with reference to FIGS. 3 through 5F.

Exemplary Formation

Figure 3:
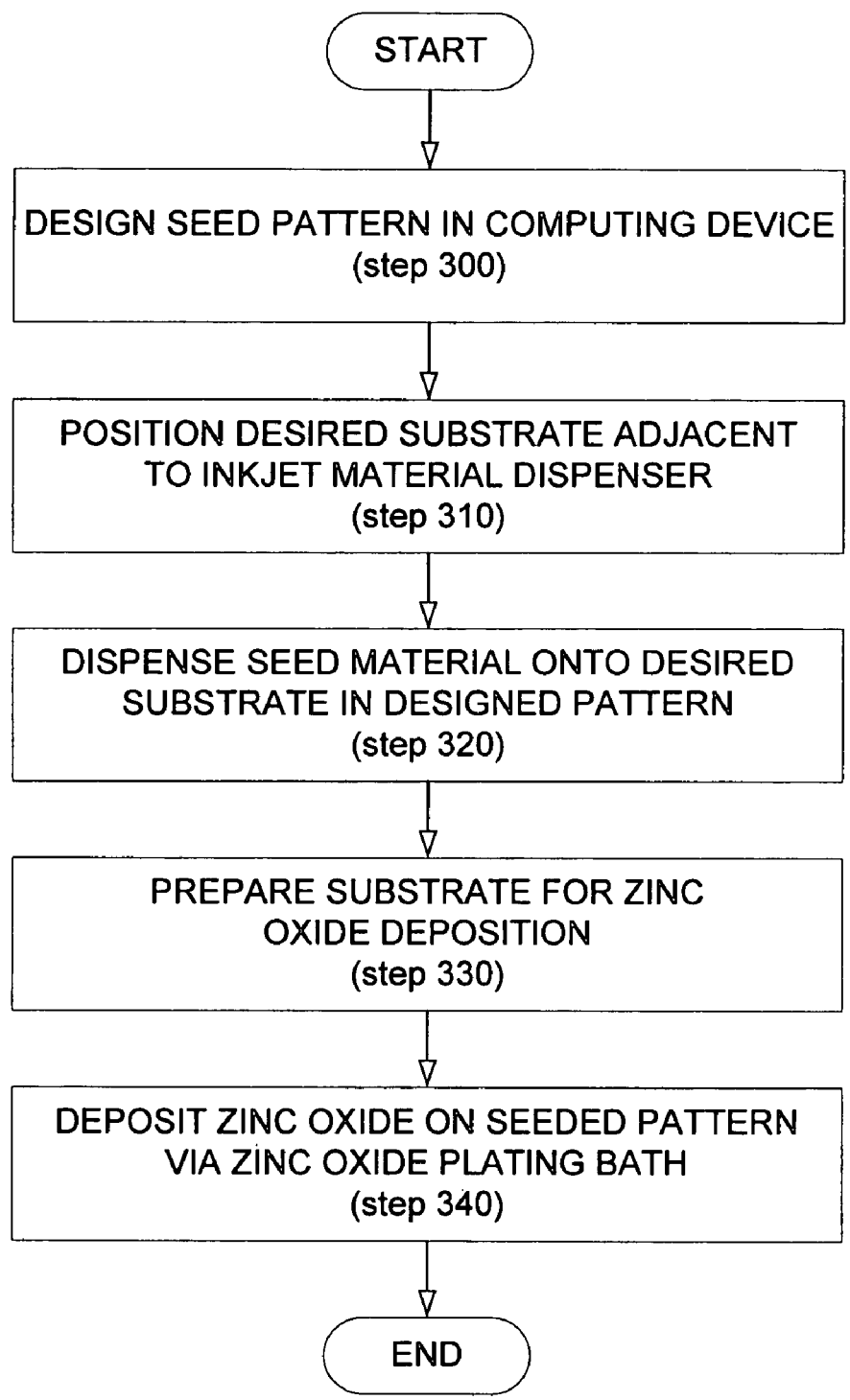
FIG. 3 illustrates a method for depositing zinc oxide, according to one exemplary embodiment.

FIG. 3 illustrates an exemplary method for depositing zinc oxide on a desired substrate (270; FIG. 2), according to one exemplary embodiment. As illustrated in FIG. 3, the present exemplary method includes designing a desired seed pattern in a computing device (step 300). Once a desired seed pattern is formed, the desired substrate is positioned adjacent to the inkjet material dispenser (250; FIG. 2) of the exemplary system (step 310). With the desired substrate in a proper position, the seed material is dispensed onto the desired substrate according to the previously designed pattern (step 320). After the seed material has been dispensed, the substrate containing the seed material is prepared for zinc oxide deposition, according to a number of exemplary embodiments (step 330). Once prepared, the zinc oxide is deposited on the desired substrate (step 340). Further details of each of the above-mentioned steps will be described in further detail below.

As mentioned, the present exemplary method begins by first designing the desired seed pattern on a computing device (step 300). According to one exemplary embodiment, the desired seed pattern is designed on a trace design application stored in the memory (215; FIG. 2) of the computing device (step 210; FIG. 2). Once the desired seed pattern has been developed and graphically represented on the computing device (210; FIG. 2), the resulting pattern is converted into a number of sequential servo commands configured to controllably maneuver the servo mechanisms (220; FIG. 2) and inkjet material dispenser (250; FIG. 2) of the exemplary system (200; FIG. 2), as will be described in further detail below.

With the seed pattern design formed (step 300), the desired substrate (270; FIG. 2) is positioned adjacent to the inkjet material dispenser (step 310). As illustrated in FIG. 5A, the desired substrate (270) is positioned adjacent to the inkjet material dispenser (250) by the transporting medium (280).

As illustrated in FIG. 3, with the desired substrate (270) correctly positioned, the seed material may be selectively dispensed onto the desired substrate according to a pre-determined pattern (step 320), prepared in a palladium isolating bath for zinc oxide deposition (step 330), and be deposited with zinc oxide on the seed material pattern (step 340). As mentioned previously, the seed material and subsequent palladium isolating bath may vary according to a number of exemplary embodiments. Two exemplary seed material deposition methods are illustrated in FIGS. 4A and 4B.

Figure 4A:
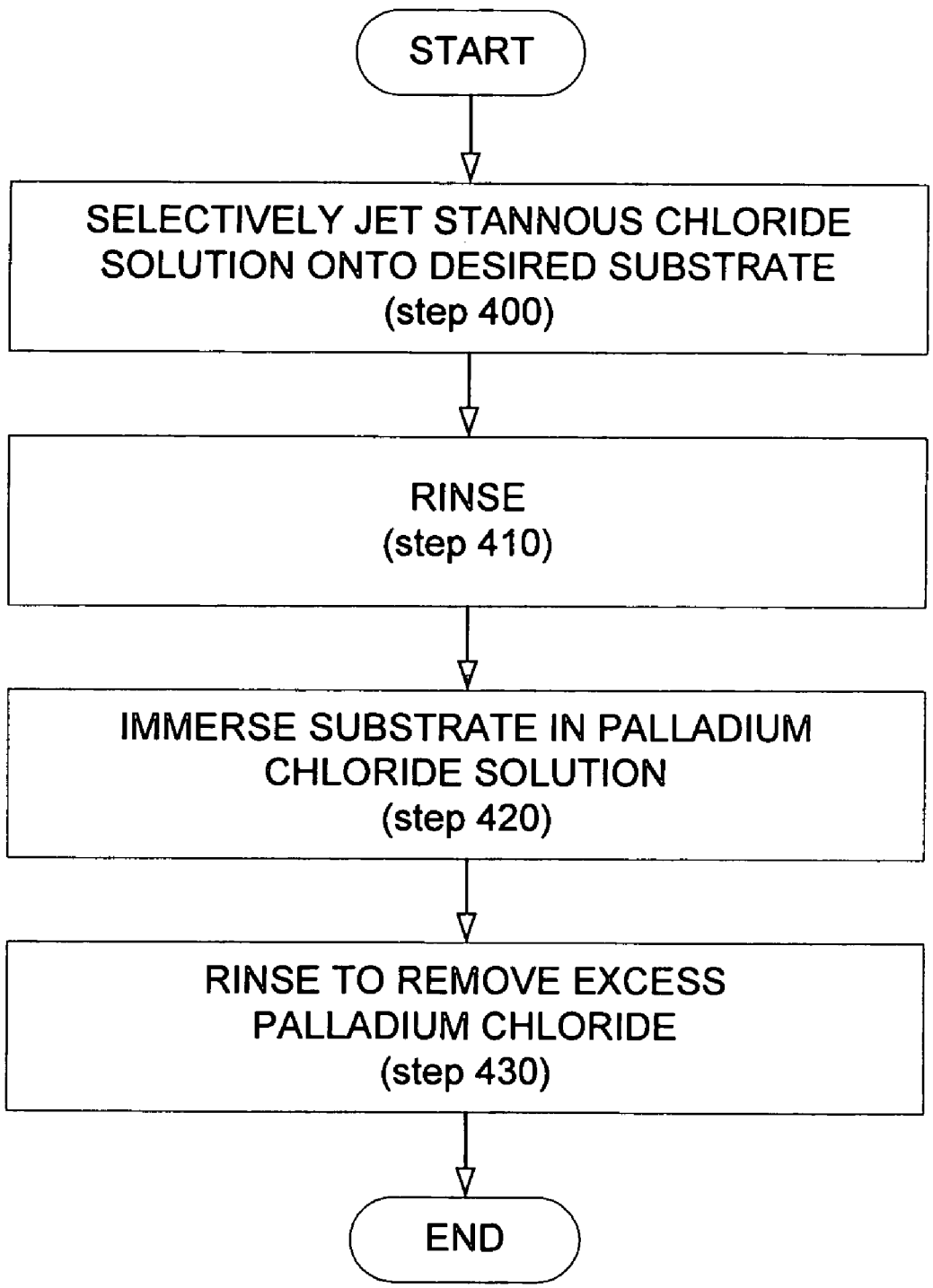
FIGS. 4A and 4B illustrate a plurality of methods for dispensing seed layers on a desired substrate, according to various exemplary embodiments.
Figure 4B:
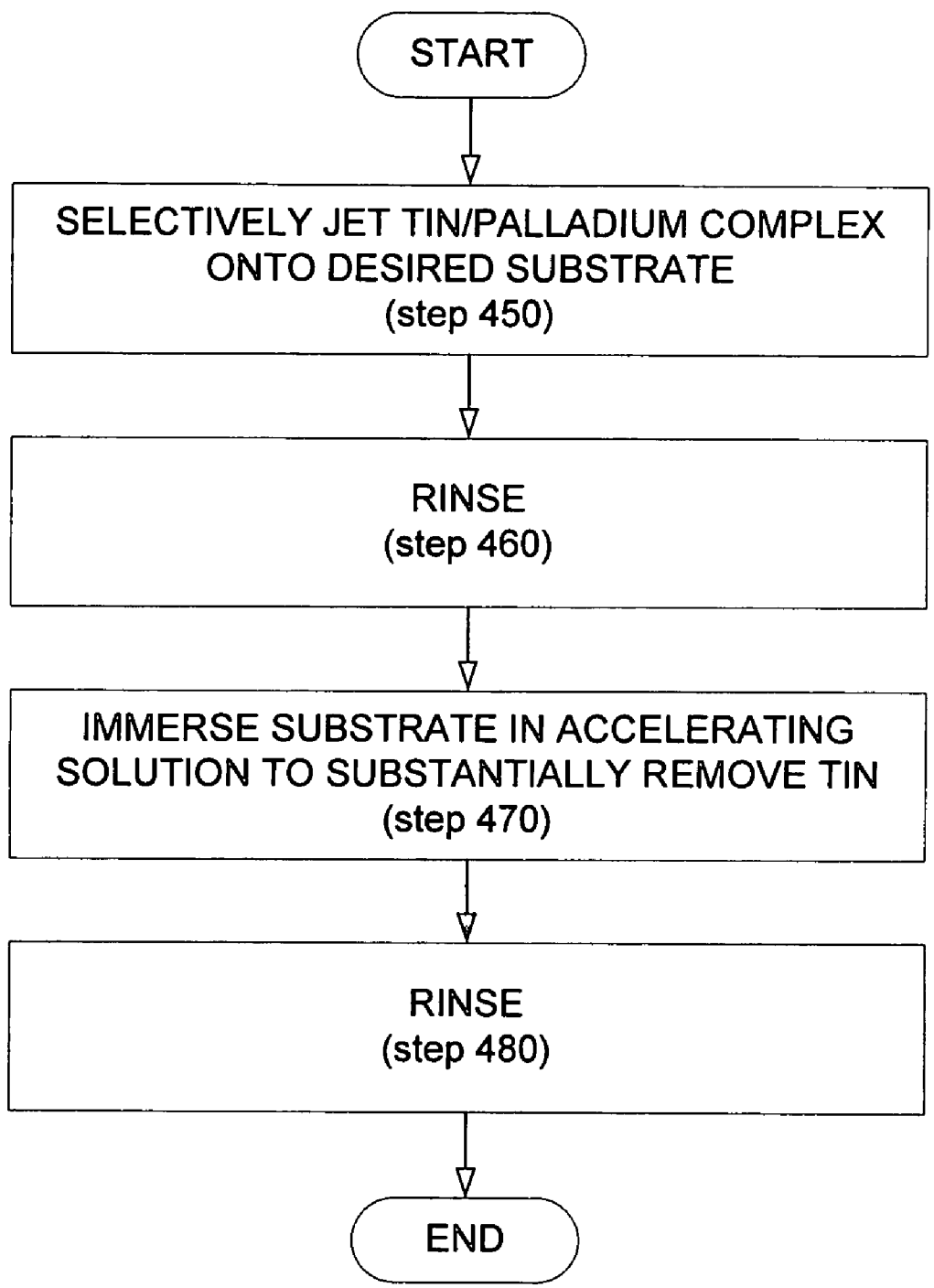

According to a first exemplary embodiment illustrated in FIG. 4A, the exemplary method includes selectively jetting stannous chloride solution onto the desired substrate (step 400), rinsing the desired substrate in a rinsing bath (step 410), immersing the desired substrate in a palladium chloride solution (step 420), and rinsing the desired substrate in a rinsing bath to remove any excess palladium chloride (step 430). The above-mentioned steps will be described in further detail below with reference to FIGS. 5A through 5F.

As mentioned, the first exemplary method for selectively depositing seed material begins by selectively jetting stannous chloride solution onto the desired substrate (step 400). As shown in FIG. 5A, the inkjet material dispenser (250) may access a deposit of stannous chloride solution stored in the material reservoir (230) and selectively deposit the stannous chloride solution onto the desired substrate (270). According to one exemplary embodiment, the stannous chloride solution may include both stannous chloride ($Cl_2Sn$) and concentrated hydrochloric acid (HCl). Additionally, according to one exemplary embodiment, the stannous chloride solution may also include a number of additives configured to facilitate a jetting of the solution from an inkjet material dispenser. The additives may include, but are in no way limited to, pH modifiers, fillers, salts, surfactants, biocides, buffers, viscosity modifiers, sequestering agents, stabilizing agents, etc.

Selective deposition of the stannous chloride solution onto the desires substrate (270) may be further facilitated by the servo mechanisms (220) controllably translating the inkjet material dispenser (250) adjacent to the desired substrate (270). According to the exemplary embodiment shown, the deposited stannous chloride solution forms a seed material pattern (500) on the surface of the substrate. According to one exemplary embodiment, stannous ions are adsorbed by the desired substrate (S*) according to the following equation:

$$S^* + Sn^{+2}(aq) \rightarrow S^*.Sn^{+2}(ad) \qquad \text{Equation 1}$$

Figure 5B:
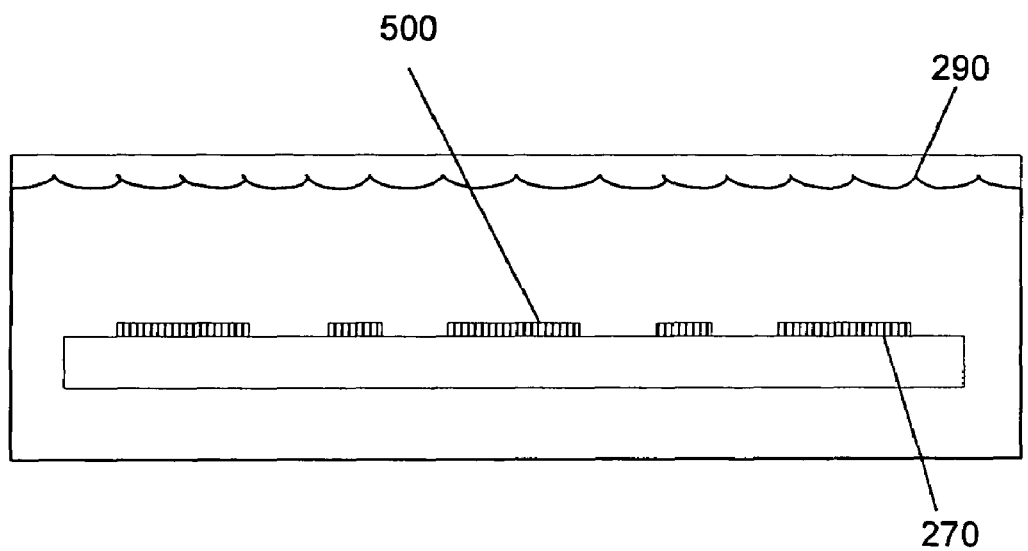
FIG. 5B is a cross-sectional side view illustrating a rinsing of a deposited seed material, according to one exemplary embodiment.

Continuing with FIG. 4A, once the stannous chloride solution has been selectively deposited onto the desired substrate (step 400) the desired substrate is rinsed in a rinsing bath (step 410). As illustrated in FIG. 5B, the desired substrate (270) having the seed material pattern (500) formed from stannous chloride is immersed in a rinsing bath (290). Immersing the substrate (270) in the rinsing bath (290) removes impurities and excess stannous chloride solution from the desired substrate (270). Consequently, a material pattern of stannous or tin ions remain on the desired substrate (270).

Figure 5C:
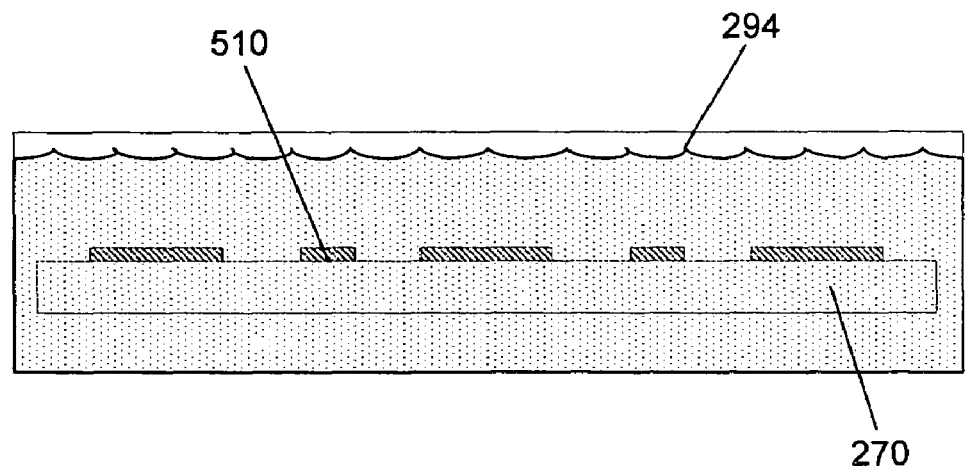
FIG. 5C is a cross-sectional side view illustrating a palladium isolating bath, according to one exemplary embodiment.
Figure 5D:
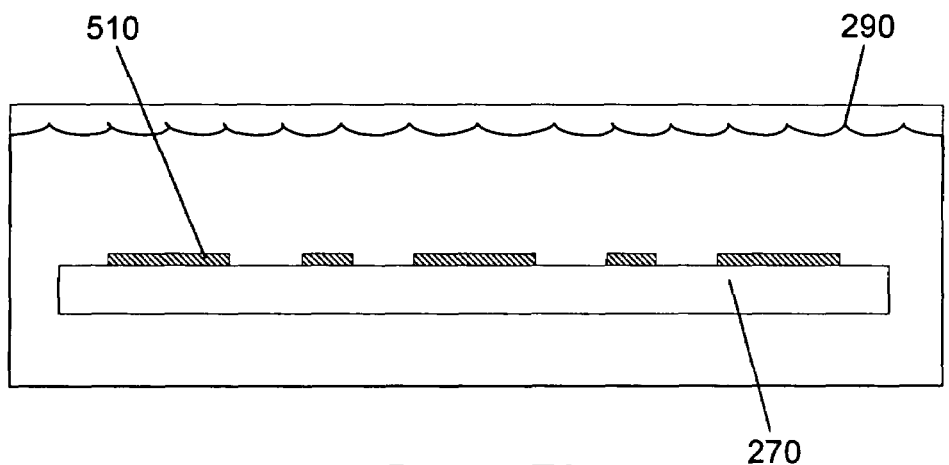
FIG. 5D is a cross-sectional side view illustrating a palladium coated substrate in a rinsing bath, according to one exemplary embodiment.

With the substrate rinsed, it may then be immersed in a palladium isolating bath containing palladium chloride and hydrochloric acid (HCl), according to the present exemplary embodiment (step 420). FIG. 5C illustrates the deposition of the desired substrate (270) in a palladium isolating bath (294). As shown, the acidic palladium chloride solution (294) controllably reacts with the stannous ions via galvanic replacement according to the following reaction:

$$S^*.Sn^{+2}(ad) + Pd^{+2}(aq) \rightarrow S^*.Pd(ad) + Sn^{+4} \qquad \text{Equation 2}$$

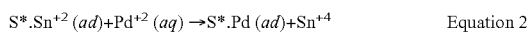

As a result of the reaction, palladium ions are reduced to a colloidal state in the shape of the seed material pattern (510) and stannous ions are released into the solution.

With the palladium ions reduced to a colloidal state in the shape of the seed material pattern (510), the substrate may again be rinsed to remove excess palladium chloride (step 430; FIG. 4), thereby preparing the substrate for zinc oxide deposition. As illustrated in FIG. 5C, the substrate (270) is again immersed in a rinsing bath (290) containing de-ionized water. Consequently, the substrate (270) is rinsed causing a seeded material pattern of catalytic palladium ions (510), as shown.

Figure 5E:
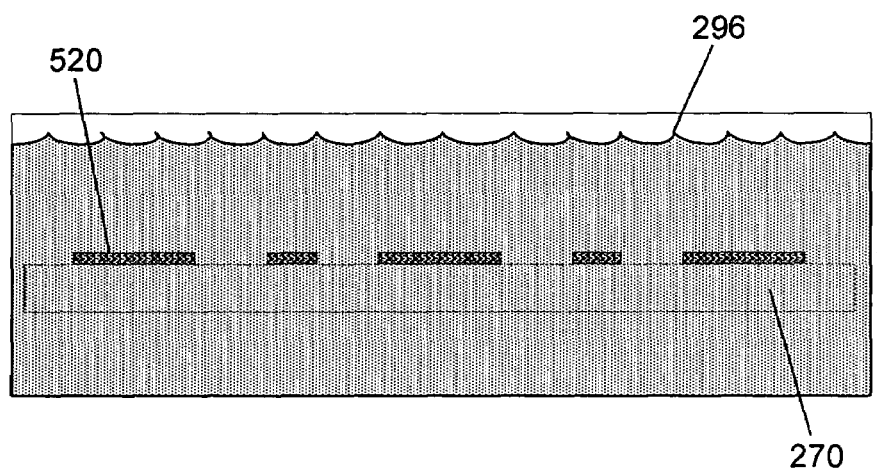
FIG. 5E is a cross-sectional side view illustrating a zinc oxide plating bath, according to one exemplary embodiment.

With the desired substrate (270) containing a seeded material pattern of catalytic palladium ions (510), the substrate is prepared for zinc oxide deposition. Returning to FIG. 3, the zinc oxide is deposited on the seeded pattern (step 340), according to one exemplary embodiment, by immersing the rinsed substrate in a zinc oxide bath. FIG. 5E illustrates the desired substrate (270) immersed in a zinc oxide bath (296). According to the exemplary illustrated embodiment, the zinc oxide bath (296) contains a solution of zinc nitrate (Zn(NO$_3$)$_2$) and dimethylamine borane (C$_2$H$_{10}$BN).

According to one exemplary embodiment, zinc nitrate is reduced by the dimethylamine borane according to the following proposed reactions illustrated in Equations 2-6:

$$Zn(NO_3)_2 \rightarrow Zn^{2+} + 2NO_3^- \quad \text{Equation 3}$$

$$(CH_3)_2NHBH_3 + H_2O \rightarrow BO_2^- + (CH_3)_2NH + 7H^+ + 6e^- \quad \text{Equation 4}$$

$$NO_3^- + H_2O + 2e^- \rightarrow NO_2^- + 2OH^- \quad \text{Equation 5}$$

$$Zn^{+2} + 2OH^- \rightarrow Zn(OH)_2 \quad \text{Equation 6}$$

$$Zn(OH)_2 \rightarrow ZnO + H_2O \quad \text{Equation 7}$$

Figure 5F:
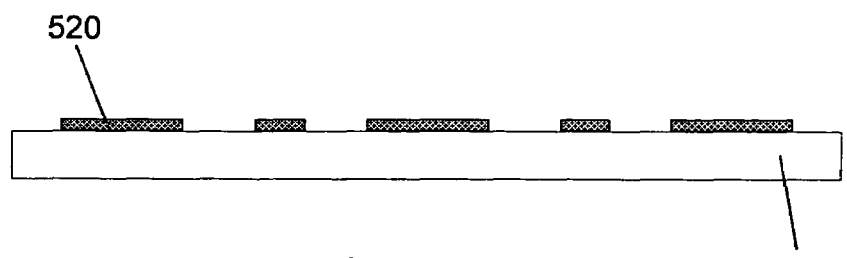
FIG. 5F is a cross-sectional side view illustrating zinc oxide deposited on a desired substrate, according to one exemplary embodiment.

As illustrated in FIGS. 5E and 5F, once the zinc oxide is formed by the above reactions, it is then attracted to and is deposited on the seeded material pattern of catalytic palladium ions (510; FIG. 5C) to form a desired zinc oxide pattern (520).

FIG. 4B illustrates an alternative method for selectively dispensing a seed material onto a desired substrate in a designated pattern (step 320; FIG. 3) and preparing the substrate for zinc oxide deposition (step 330; FIG. 3), according to a second exemplary embodiment. As shown in FIG. 4B, the second exemplary method selectively jets a tin/palladium complex onto the desired substrate (step 450) followed by a rinsing step (step 460). After the tin/palladium complex deposition is rinsed, the desired substrate is then immersed in an accelerating solution to substantially remove the tin component of the deposited tin/palladium complex (step 470). With the tin component removed from the tin/palladium complex, the substrate is again rinsed (step 480) in preparation of a zinc oxide deposition. Further details of the second exemplary method for dispensing a seed material onto a desired substrate in a designed pattern will now be described in further detail below.

As illustrated in FIG. 4B, the second exemplary method begins by selectively jetting a tin/palladium complex onto the desired substrate (step 450). Similar to the first exemplary method, the tin/palladium complex may be jetted onto the desired substrate (step 450) by the inkjet material dispenser (250; FIG. 5A). According to this exemplary embodiment, the material reservoir (230; FIG. 5A) contains a tin/palladium complex solution that includes tin ions configured to adhere to the substrate upon deposition. Further, palladium ions are associated with the tin ions, as deposited.

Once the tin/palladium complex has been deposited onto the desired substrate, the substrate is rinsed in a de-ionized water rinsing bath (step 460; FIG. 4). According to this exemplary embodiment, the rinsing in de-ionized water removes the tin/palladium ions that are not adhered to the desired substrate, according to the designed pattern.

Once rinsed, the exemplary substrate containing the tin/palladium ions formed in a desired pattern is immersed in an accelerating solution to substantially remove the tin ions from the desired pattern (step 470). More specifically, according to one exemplary embodiment, the desired substrate, having the tin/palladium ions formed thereon, is submerged in a solution of fluoroboric acid and sulfuric acid. According to one exemplary embodiment, the accelerating solution is configured to form intermediaries and remove the excess tin ions, thereby exposing the palladium ions making the deposition catalytically active.

Once the palladium ions are exposed and catalytically active, the substrate is again rinsed (step 480) to remove excess accelerator and/or tin in preparation of being submerged in a zinc oxide plating bath for the reception of zinc oxide depositions (step 340; FIG. 3) as described above. A number of exemplary zinc oxide depositions were performed according to the above-mentioned exemplary methods. Crystal structures and characteristics of the experimental depositions will be described in detail below.

EXAMPLES

According to one exemplary embodiment, the above-mentioned reactions were confirmed by first immersing a substrate in a solution of stannous chloride (5 gm/l of SnCl$_2$ and 5 ml/l of concentrated HCl)] for approximately one minute followed by a rinsing of the substrate with a de-ionized water solution. After deposition of the stannous chloride, the sample was activated by immersing it in a palladium chloride solution including approximately 1% PdCl$_2$ and 0.4% concentrated HCl for about a minute followed again with rinsing of the substrate with a de-ionized water solution. During the exemplary experiment, the sample was kept wet between the sensitization and the activation steps, as well as before ZnO deposition.

After the activation and rinsing of the sample, a zinc oxide bath was prepared with approximately 30 g/L of Zn(NO$_3$)$_2$ and 6 g/L of DMAB. A constant temperature bath was used to maintain the temperature of the bath between approximately 55 and 65° C. Additionally, pH of the freshly prepared bath was approximately 5.8. Once the bath was prepared, two to three samples were deposited in the bath to receive zinc oxide depositions before the bath was discarded. During deposition, zinc oxide was formed on the substrate. After deposition, the pH of the bath was approximately 6.3. Typical bath volume was approximately 50 ml.

Figure 6A:
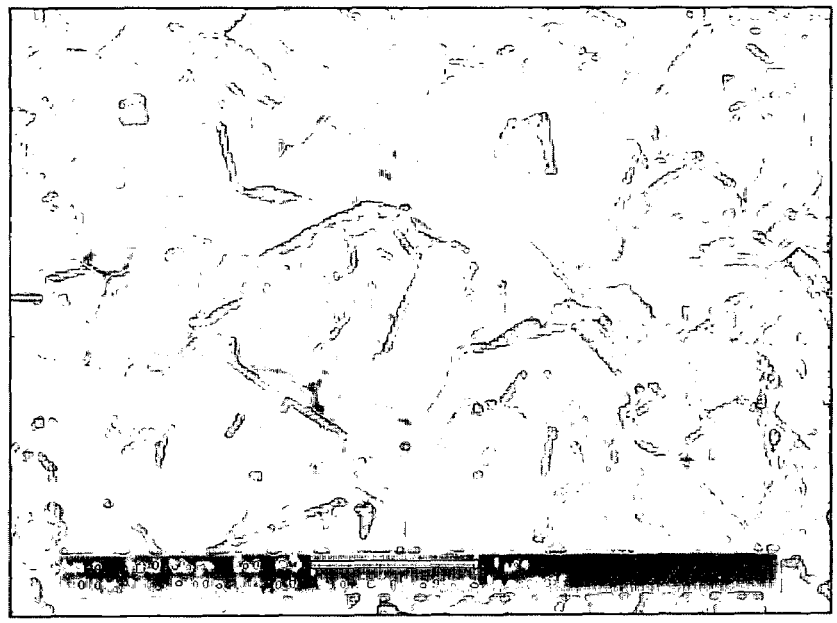
FIGS. 6A and 6B are scanning electron microscope images of zinc oxide crystal structures that result from the deposition of zinc oxide, according to various embodiments.
Figure 6B:
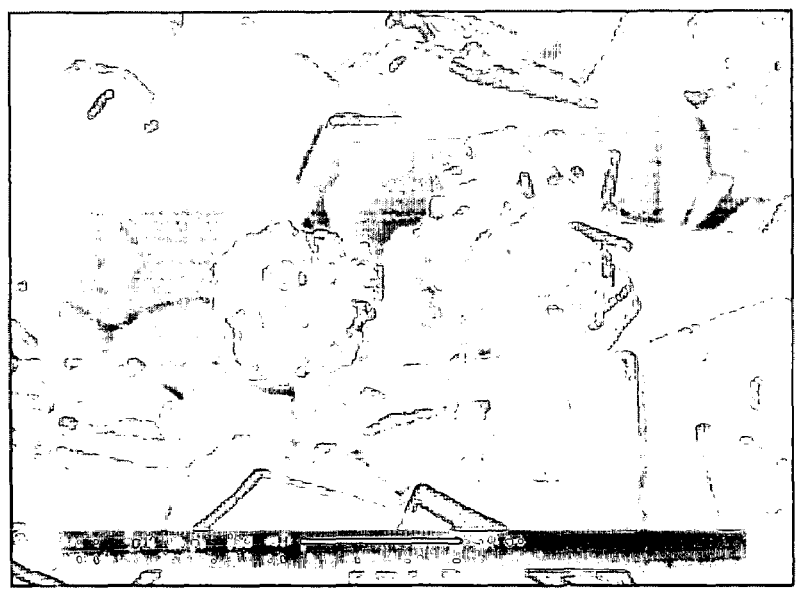

The first zinc oxide deposition attempt was made on a glass substrate cleaned with hexane followed by iso-propyl alcohol (IPA). To validate the above-mentioned methods, the substrate was activated with SnCl$_2$/PdCl$_2$ as mentioned above. ZnO was then deposited after immersion in a zinc oxide bath forming hexagonal zinc oxide crystal structures, as confirmed by scanning electron microscope (SEM) images. FIGS. 6A and 6B are SEM images illustrating the resulting zinc oxide crystal structures.

Figure 7A:
FIGS. 7A and 7B are scanning electron microscope images of a resulting zinc-oxide crystal structure when deposited according to various embodiments.
Figure 7B:
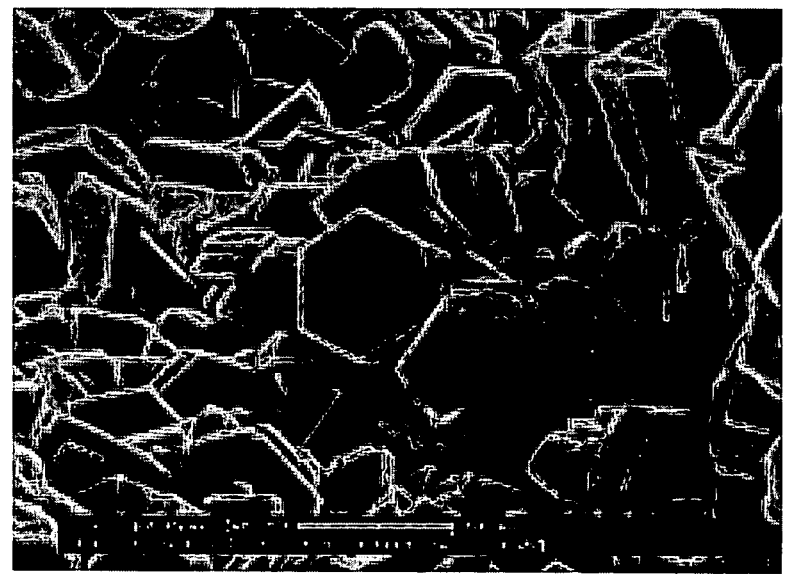

Additionally, a first 3M transparency was deposited with a palladium seed layer as illustrated above and a second 3M transparency was deposited without the palladium seed layer to evaluate the effect of the palladium seed layer. FIG. 7A illustrates the zinc oxide crystals that resulted without the deposition of a palladium seed layer. As illustrated, the resulting zinc oxide crystals were not well defined. In contrast, FIG. 7B is an SEM image of the zinc oxide crystals that result after the deposition of a palladium seed layer as described above.

As noted, the crystals are more defined after the deposition of the palladium seed layer, resulting in improved semiconducting behavior.

The zinc oxide as produced by the present exemplary systems and methods described herein are expected to provide very satisfactory electrical performance, specifically in the area of channel mobility. In addition, for certain zinc oxides described herein, the channel can be transparent in one, both, or more of the ultraviolet, visible, and/or infrared portions of the electromagnetic spectrum, allowing for an entire thin-film transistor to be optically transparent throughout the visible region of the electromagnetic spectrum.

In conclusion, the present systems and methods for forming a seed layer for use in electroless plating of materials such as zinc oxide on a desired substrate include patterning a palladium or other seed layer onto a desired substrate with an inkjet material dispenser prior to the deposition of a metallic material such as zinc oxide. According to one exemplary embodiment, the palladium seed patterning described herein is an additive process which reduces the overall waste of the system, is modifiable very rapidly, results in a highly crystalline zinc oxide deposition, and reduces the overall cost of zinc oxide deposition, compared to traditional methodologies.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. A method for forming a zinc oxide layer on a substrate comprising:
    selectively dispensing a seed material from an inkjet material dispenser onto a substrate according to a desired pattern of zinc oxide on said substrate, wherein said seed material is configured to produce a zinc oxide layer on said substrate by electroless plating, said zinc oxide layer corresponding to said pattern of said dispensed seed material; and
    exposing said substrate to a zinc oxide plating material to form said zinc oxide layer on said substrate corresponding to said pattern of said dispensed seed material.

2. The method of claim 1, wherein said seed material comprises one of a stannous chloride or a tin/palladium complex.

3. The method of claim 1, wherein generating said seed layer design comprises:
    graphically generating said pattern on a computing device; and
    converting said pattern to a plurality of servo commands configured to control said selective dispensing of said seed material.

4. The method of claim 1, further comprising forming a channel layer of a transistor from said zinc oxide layer.

5. The method of claim 1, further comprising converting said seed layer to palladium prior to exposing said substrate to a zinc oxide plating material.

6. The method of claim 5, wherein said converting said seed layer to palladium comprises exposing a stannous chloride seed layer to a palladium chloride solution.

7. The method of claim 5, wherein said converting said seed layer to palladium comprises exposing a tin/palladium complex to an accelerating solution.

8. The method of claim 7, wherein said accelerating solution comprises fluoroboric acid and sulfuric acid.

9. The method of claim 1, wherein said zinc oxide plating material comprises a solution of zinc nitrate ($Zn(NO_3)_2$) and dimethylamine borane ($C_2H_{10}BN$).

10. The method of claim 9, wherein exposing said substrate to a zinc oxide plating material comprises immersing said substrate in a solution of zinc nitrate ($Zn(NO_3)_2$) and dimethylamine borane ($C_2H_{10}BN$).

11. A method for depositing material on a substrate via electroless plating comprising:
    selectively depositing a seed material onto said substrate with an inkjet material dispenser, said seed material being configured to aid in formation of a controllable electric pathway, wherein said seed material comprises a tin/palladium complex; and
    exposing said substrate to at least one solution configured to react with said seed material to form a catalytic coating on said substrate; and
    exposing said substrate to a zinc oxide plating solution to produce a zinc oxide layer with said catalytic coating, said zinc oxide layer having a pattern corresponding to a pattern of said selective-deposited seed material.

12. The method of claim 11, wherein said exposing said substrate to at least one solution configured to react with said seed material to form a catalytic coating on said substrate comprises immersing said substrate in said solution.

13. The method of claim 11, wherein said selectively depositing a seed material onto said substrate with an inkjet material dispenser comprises:
    graphically generating a seed pattern on a computing device;
    converting said graphical seed pattern into a number of servo commands; and
    sending said servo commands to a servo mechanism associated with said inkjet material dispenser to cause said inkjet material dispenser to dispenser said seed material according to said seed pattern.

14. The method of claim 11, wherein said zinc oxide plating solution comprises zinc nitrate ($Zn(NO_3)_2$) and dimethylamine borane ($C_2H_{10}BN$).

15. The method of claim 11, wherein said exposing said substrate to at least one solution configured to react with said seed material to form a catalytic coating on said substrate comprises:
    immersing said substrate in an accelerating solution.

16. The method of claim 15, wherein said accelerating solution is configured to substantially remove tin from said tin/palladium complex.

17. The method of claim 15, wherein said accelerating solution comprises fluoroboric acid and sulfuric acid.

18. The method of claim 11, further comprising rinsing said substrate between said selectively depositing a seed material and exposing said substrate to at least one solution configured to react with said seed material.

19. The method of claim 18, wherein said rinsing comprises immersing said substrate in de-ionized water.

* * * * *